United States Patent
Ozaki et al.

(10) Patent No.: US 9,655,291 B2
(45) Date of Patent: May 16, 2017

(54) MULTILAYER MAGNETIC SHIELD

(71) Applicants: Kobe Steel, Ltd., Kobe-shi (JP); JAPAN SUPERCONDUCTOR TECHNOLOGY INC., Kobe-shi (JP)

(72) Inventors: Osamu Ozaki, Kobe (JP); Yoshio Okui, Kobe (JP); Takeshi Kamikado, Kobe (JP)

(73) Assignees: Kobe Steel, Ltd., Kobe-shi (JP); JAPAN SUPERCONDUCTOR TECHNOLOGY INC., Kobe-shi (JP)

( * ) Notice: Subject to any disclaimer, the term of this patent is extended or adjusted under 35 U.S.C. 154(b) by 0 days.

(21) Appl. No.: 15/188,328

(22) Filed: Jun. 21, 2016

(65) Prior Publication Data

US 2016/0381843 A1    Dec. 29, 2016

(30) Foreign Application Priority Data

Jun. 26, 2015    (JP) ................................. 2015-128456

(51) Int. Cl.
| H01F 1/00 | (2006.01) |
| H05K 9/00 | (2006.01) |
| H01F 6/06 | (2006.01) |

(52) U.S. Cl.
CPC ............. H05K 9/0075 (2013.01); H01F 6/06 (2013.01)

(58) Field of Classification Search
CPC .............. G01V 3/00; G01R 33/28; H01F 5/00
USPC ........................................................ 335/216
See application file for complete search history.

(56) References Cited

U.S. PATENT DOCUMENTS

| 4,180,769 A | * | 12/1979 | Gang ................. G01R 33/3875 |
| | | | 324/319 |
| 4,590,428 A | | 5/1986 | Muller et al. |
| 4,680,666 A | * | 7/1987 | Rios ................... G01R 33/3815 |
| | | | 335/301 |

(Continued)

FOREIGN PATENT DOCUMENTS

| JP | 3-57776 | 9/1991 |
| JP | 2013-137131 | 7/2013 |
| JP | 2013-138058 | 7/2013 |

*Primary Examiner* — Shawki S Ismail
*Assistant Examiner* — Lisa Homza
(74) *Attorney, Agent, or Firm* — Oblon, McClelland, Maier & Neustadt, L.L.P.

(57) ABSTRACT

Provided is a multilayer magnetic shield 21 formed of magnetic materials and disposed on the outer side of a superconducting magnet 11, the multilayer magnetic shield 21 including a first magnetic shield 1 disposed on the outer side of the superconducting magnet 11 and a second magnetic shield 2 disposed on the outer side of the first magnetic shield 1. The first magnetic shield 1 includes a first cylinder section 1a enclosing the superconducting magnet 11 and a pair of first flange sections 1b connected to the first cylinder section 1a. The second magnetic shield 2 includes a second cylinder section 2a enclosing the first cylinder section 1a and a pair of second flange sections 2b connected to the second cylinder section 2a. The second cylinder section 2a is disposed in a position with a predetermined space S from the first cylinder section 1a in the radial direction of the first cylinder section 1a. The pair of second flange sections 2b is disposed in positions with the predetermined space S from the pair of first flange sections 1b in the axial direction of the first cylinder section 1a.

3 Claims, 6 Drawing Sheets

(56) References Cited

U.S. PATENT DOCUMENTS

| | | | | |
|---|---|---|---|---|
| 4,876,510 A * | 10/1989 | Siebold | G01R 33/3815 | 324/318 |
| 4,924,185 A * | 5/1990 | Matsutani | F17C 3/085 | 324/319 |
| 5,001,447 A * | 3/1991 | Jayakumar | G01R 33/421 | 324/320 |
| 5,001,448 A * | 3/1991 | Srivastava | G01R 33/421 | 324/318 |
| 5,012,217 A * | 4/1991 | Palkovich | G01R 33/421 | 324/318 |
| 5,084,676 A * | 1/1992 | Saho | G01R 33/3854 | 324/318 |
| 5,296,812 A * | 3/1994 | Kitamura | G01R 33/3815 | 324/319 |
| 5,309,106 A * | 5/1994 | Miyajima | G01R 33/383 | 324/318 |
| 5,396,173 A * | 3/1995 | Sakakura | H01G 2/22 | 324/318 |
| 5,469,123 A * | 11/1995 | Muller | G01R 33/421 | 174/385 |
| 5,581,223 A * | 12/1996 | Ono | G01R 33/421 | 324/318 |
| 5,623,240 A * | 4/1997 | Sakuraba | H01F 6/065 | 174/15.4 |
| 5,633,588 A * | 5/1997 | Hommei | G01R 33/3815 | 324/319 |
| 5,635,839 A * | 6/1997 | Srivastava | G01R 33/3873 | 324/318 |
| 5,721,523 A * | 2/1998 | Dorri | G01R 33/3806 | 324/319 |
| 5,757,257 A * | 5/1998 | Doi | H01L 39/20 | 324/318 |
| 6,060,971 A * | 5/2000 | Sasaki | C30B 15/305 | 117/32 |
| 6,078,234 A * | 6/2000 | Huang | B82Y 15/00 | 324/319 |
| 6,147,579 A * | 11/2000 | Einziger | F17C 13/001 | 335/216 |
| 6,889,070 B2 * | 5/2005 | Tsuda | G01R 33/3806 | 324/318 |
| 7,126,448 B2 * | 10/2006 | Watanabe | G01R 33/3815 | 324/318 |
| 2003/0107376 A1 * | 6/2003 | Yasuhara | G01R 33/3854 | 324/318 |
| 2004/0212364 A1 * | 10/2004 | Morita | G01R 33/34007 | 324/318 |
| 2006/0220646 A1 * | 10/2006 | Kurome | G01R 33/3854 | 324/318 |
| 2010/0176811 A1 * | 7/2010 | Tsuda | G01R 33/422 | 324/318 |

\* cited by examiner

FIG.3

COMPARATIVE EXAMPLE

MULTILAYER MAGNETIC SHIELD

TECHNICAL FIELD

The present invention relates to a magnetic shield formed of magnetic materials and disposed on the outer side of a superconducting magnet.

BACKGROUND ART

In a process for manufacturing a semiconductor element used in a magnetic random access memory (MRAM), a magneto-resistance effect type head, or the like, it is necessary to perform heat treatment of an object to be treated, in which a large number of 12-inch silicon wafers are stacked, while applying a high magnetic field equal to or larger than 500 gausses to the object to be treated. Therefore, it is necessary to secure a large space as a heat treatment space. Since the high magnetic field has to be generated in the large space, a superconducting magnet is used as a generation source of the high magnetic field (e.g., Japanese Unexamined Patent Publication No. 2013-138058).

Since the high magnetic field is generated in the large space, when a magnetic shield is not applied, a magnetic field from the superconducting magnet leaks to a wide range. An in-magnetic field heat treatment apparatus described in Japanese Unexamined Patent Publication No. 2013-138058 is set in a clean room. Therefore, a footprint is desirably small. The SEMI standard, which is a standard of a semiconductor manufacturing apparatus, provides that a fringe field in a position 1 m or more apart from the outer wall of the apparatus should be reduced to 5 gausses or less.

As a method of applying the magnetic shield, there are a method by an active shield and a method by a passive shield. The method by the active shield is described in, for example, paragraph 0019 of the specification and FIG. 3 of Japanese Unexamined Patent Publication No. 2013-137131. This method is a method of disposing, on the outer side of a superconducting magnet, a shield coil that is made of a superconductive conductor and generates an inverted magnetic field. The method by the passive shield is described in, for example, FIG. 1 of Japanese Examined Patent Publication No. H03-57776. This method is a method of disposing a magnetic material such as iron on the outer side of a cold insulation container (a cryostat) of a superconducting magnet.

The active shield method has an advantage that the superconducting magnet (a device) is not heavy because the magnetic material such as iron is not used. However, there is a concern that, when quenching occurs, a balance between generated magnetic fields of the shield coil and a coil on the inner side of the shield coil collapses and, therefore, a fringe field increases. On the other hand, in the passive shield method, there is no concern about the increase in the fringe field due to the quenching. However, since many magnetic materials such as iron are used as the magnetic shield, the device is increased in weight.

SUMMARY OF INVENTION

An object of the present invention is to provide a magnetic shield (a passive shield) formed of magnetic materials and disposed on the outer side of a superconductive magnet, the magnetic shield being capable of suppressing an increase in a fringe field due to quenching while avoiding a marked increase in weight.

A multilayer magnetic shield according to an aspect of the present invention is a multilayer magnetic shield formed of magnetic materials and disposed on the outer side of a superconducting magnet, the multilayer magnetic shield including: a first magnetic shield disposed on the outer side of the superconducting magnet; and a second magnetic shield disposed on the outer side of the first magnetic shield. The first magnetic shield includes: a first cylinder section formed in a cylindrical shape and enclosing the superconducting magnet from the outer side in the radial direction of the superconducting magnet; and a pair of first flange sections connected to an end portion in the axial direction of the first cylinder section and extending from the end portion inward in the radial direction of the first cylinder section. The second magnetic shield includes: a second cylinder section formed in a cylindrical shape larger than the first cylinder section and enclosing the first cylinder section from the outer side in the radial direction of the first cylinder section; and a pair of second flange sections connected to an end portion in the axial direction of the second cylinder section and extending from the end portion inward in the radial direction of the second cylinder section. The second cylinder section is disposed in a position with a predetermined space from the first cylinder section in the radial direction of the first cylinder section. The pair of second flange sections is disposed in positions with the predetermined space from the pair of first flange sections in the axial direction of the first cylinder section.

DESCRIPTION OF EMBODIMENTS

Modes for carrying out the present invention are explained below with reference to the drawings.

First Embodiment

A multilayer magnetic shield 21 according to a first embodiment of the present invention is explained with reference to FIG. 1. The multilayer magnetic shield 21 is disposed on the outer side of a cryostat 12 (a cold insulation container), which stores a superconducting magnet 11, to enclose the cryostat 12. The superconducting magnet 11 is a magnet having a cylindrical shape formed by winding a superconducting wire rod around a frame body (a former). The cryostat 12 also has a cylindrical shape. A coolant such as liquid helium or liquid nitrogen is stored in the cryostat 12 together with the superconducting magnet 11. A freezing machine is sometimes connected to the cryostat 12.

The multilayer magnetic shield 21 includes a first magnetic shield 1 disposed on the outer side of the cryostat 12, which stores the superconducting magnet 11 and the like, and a second magnetic shield 2 disposed on the outer side of the first magnetic shield 1. The multilayer magnetic shield 21 in this embodiment is a magnetic shield of a two-layer structure configured by only the first magnetic shield 1 and the second magnetic shield 2. A magnetic material, which is the material of the multilayer magnetic shield 21 (the first magnetic shield 1 and the second magnetic shield 2), is, for example, iron. Note that the magnetic material is sometimes expressed as ferromagnetic material rather than magnetic material.

The first magnetic shield 1 includes a first cylinder section 1a formed in a cylindrical shape and a pair of first flange sections 1b connected to an end portion on the axial direction (a Z-axis direction) of the first cylinder section 1a in the first cylinder section 1a.

The first cylinder section 1a has a shape enclosing the superconducting magnet 11 from the outer side in the radial direction of the superconducting magnet 11. In this embodiment, the first cylinder section 1a is formed in a cylindrical shape.

The pair of first flange sections 1b has a shape extending from the end portion of the first cylinder section 1a inward (to the inner side) in the radial direction of the first cylinder section 1a. The pair of first flange sections 1b is formed in a ring shape. That is, circular holes are formed in the centers of the pair of first flange sections 1b. The thickness of the first flange section 1b is set equal to thickness t1 of the first cylinder section 1a.

The second magnetic shield 2 includes a second cylinder section 2a formed in a cylindrical shape and a pair of second flange sections 2b connected to an end portion in the axial direction (the Z-axis direction) of the second cylinder section 2a in the second cylinder section 2a.

The second cylinder section 2a has a shape enclosing the first cylinder section 1a from the outer side in the radial direction of the first cylinder section 1a. In this embodiment, the second cylinder section 2a is also formed in a cylindrical shape. The second cylinder section 2a is disposed in a position with a predetermined space S from the outer circumferential surface of the first cylinder section 1a in the radial direction of the first cylinder section 1a. The length in the axial direction of the second cylinder section 2a is set larger than the length in the axial direction of the first cylinder section 1a. In this embodiment, thickness t2 of the second cylinder section 2a is set equal to the thickness t1 of the first cylinder section 1a.

The pair of second flange sections 2b has a shape extending from the end portion of the second cylinder section 2a inward (to the inner side) in the radial direction of the second cylinder section 2a. The pair of second flange sections 2b is formed in a ring shape. That is, circular holes are formed in the centers of the pair of second flange sections 2b as well. A diameter D of the circular hole formed in the second flange section 2b is set the same as the diameter of the circular hole formed in the first flange section 1b. The thickness of the second flange section 2b is set equal to the thickness t2 of the second cylinder section 2a. The pair of second flange sections 2b is disposed in positions with the space S from the pair of first flange sections 1b in the axial direction (the Z-axis direction) of the first cylinder section 1a. In this way, flange sections of the first magnetic shield 1 and the second magnetic shield 2 are not common flange sections. Like the relation between the first cylinder section 1a and the second cylinder section 2a, the flange sections are independent flange sections 1b and 2b disposed with the predetermined space S therebetween.

Note that the space S between the first magnetic shield 1 and the second magnetic shield 2 is desirably set to 20% or more of the thickness t1 (t2) of the first magnetic shield 1 (the second magnetic shield 2). An air layer (a gap) may be formed between the first magnetic shield 1 and the second magnetic shield 2. Alternatively, an object such as a structure formed of a nonmagnetic material may be disposed between the first magnetic shield 1 and the second magnetic shield 2.

When the superconducting magnet 11 is used as a magnetic field generation source of an in-magnetic field heat treatment apparatus, a heater (heating means) is set in an inner side space of the cryostat 12 having a cylindrical shape. An object to be treated is inserted into the inner side space of the cryostat 12, in which the heater is set, from the hole portion of the flange section 1b or 2b.

As explained above, the multilayer magnetic shield 21 in this embodiment includes the first magnetic shield 1 and the second magnetic shield 2 respectively formed of magnetic materials, and the first magnetic shield 1 and the second magnetic shield 2 are disposed with the predetermined space S therebetween. Therefore, an inverted magnetic field effect of the magnetic shields is weakened and the magnetic shields are easily magnetized. Therefore, it is possible to suppress an increase in a fringe field due to quenching while avoiding a marked increase in weight. In other words, it is possible to obtain, using magnetic materials fewer than in the past, a shield effect equivalent to the shield effect of the magnetic shield by the conventional passive shield method. That is, it is possible to reduce the weight of the magnetic shield (the passive shield) formed of the magnetic materials and disposed on the outer side of the superconducting magnet 11.

The multilayer magnetic shield 21 includes the flange sections 1b and 2b that are not common flange sections and are independent from each other. Therefore, since the magnetization of the magnetic shields 1 and 2 including the flange sections 1b and 2b is improved, it is possible to further reduce an amount of use of the magnetic materials.

In the multilayer magnetic shield 21, the space S between the magnetic shields adjacent to each other is set to 20% or more of the thickness of the magnetic shields 1 and 2. Therefore, the easiness of the magnetization of the magnetic shields 1 and 2 is further improved.

Second Embodiment

Figure 2:
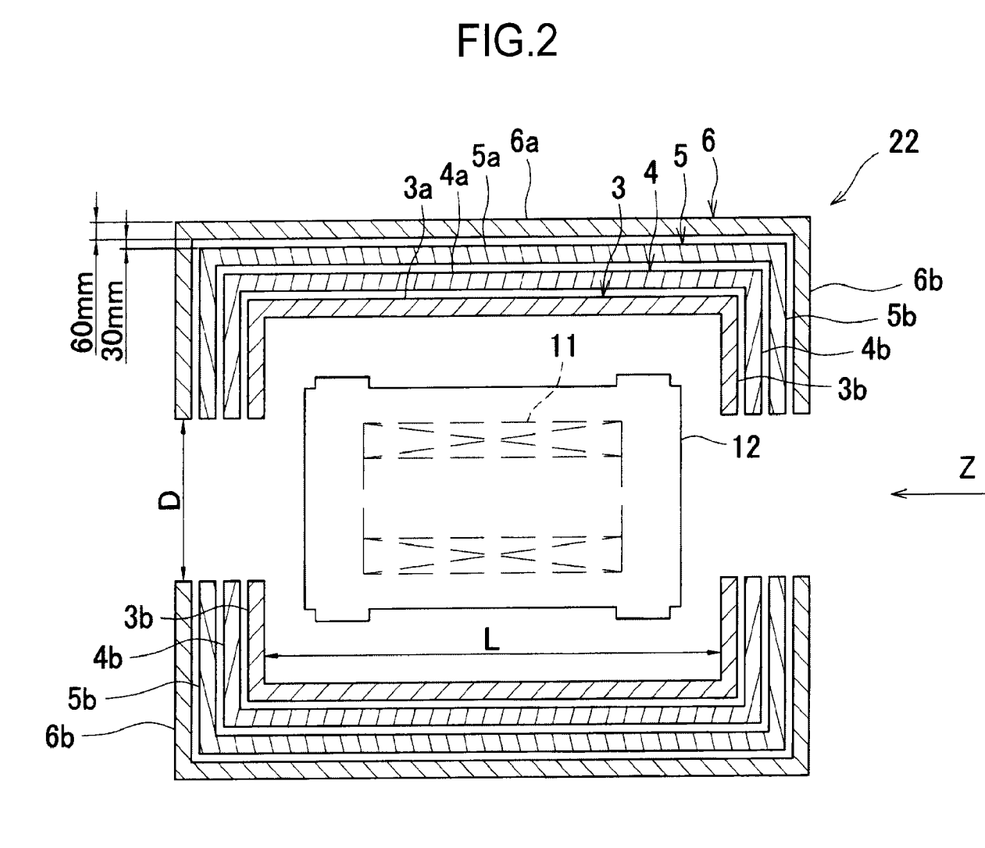
FIG. 2 is a side sectional view showing a state in which a multilayer magnetic shield according to a second embodiment of the present invention is disposed to surround a cryostat.

FIG. 2 is a diagram showing a multilayer magnetic shield 22 according to a second embodiment of the present invention. A difference between the second embodiment and the first embodiment is the number of layers (the number) of magnetic shields. That is, the multilayer magnetic shield 21 in the first embodiment includes magnetic shields formed of magnetic materials in two layers, that is, the first magnetic shield 1 and the second magnetic shield 2. On the other hand, the multilayer magnetic shield 22 in the second embodiment includes magnetic shields formed of magnetic materials in four layers, that is, a first magnetic shield 3, a second magnetic shield 4, a third magnetic shield 5, and a fourth magnetic shield 6 in order from the cryostat 12 side. Like the magnetic shields 1 and 2 in the first embodiment, the magnetic shields 3 to 6 in this embodiment respectively include cylinder sections 3a, 4a, 5a, and 6a disposed on the outer side in the radial direction of the superconducting magnet 11 and pairs of flanges 3b and 4b and 5b and 6b connected to end portions in the axial direction (the Z-axis direction) of the cylinder sections. The second embodiment is the same as the first embodiment in that, for example, the magnetic shields 3 to 6 are disposed at an interval and the thicknesses of the magnetic shields 3 to 6 are set equal to one another. The second embodiment is different from the first embodiment only in the number of layers of the magnetic shields.

The multilayer magnetic shield 22 in this embodiment includes the magnetic shields in the four layers. Therefore, the effects explained above are further improved.

The embodiments of the present invention are explained above. Besides, naturally, various changers are possible within a range assumable by those skilled in the art.

For example, the sectional shape of the cylinder sections in the embodiments may be a polygonal shape such as an octagonal shape rather than the circle.

In the embodiments, the multilayer magnetic shields including the two layers (FIG. 1) and the four layers (FIG. 2) are illustrated. However, the numbers of layers of the magnetic shields are not limited to these numbers. That is, a multilayer magnetic shield only has to include a plurality of magnetic shields disposed with a space therebetween.

EXAMPLE

An example of the embodiments is explained below together with a comparative example.

Comparative Example

Figure 3:
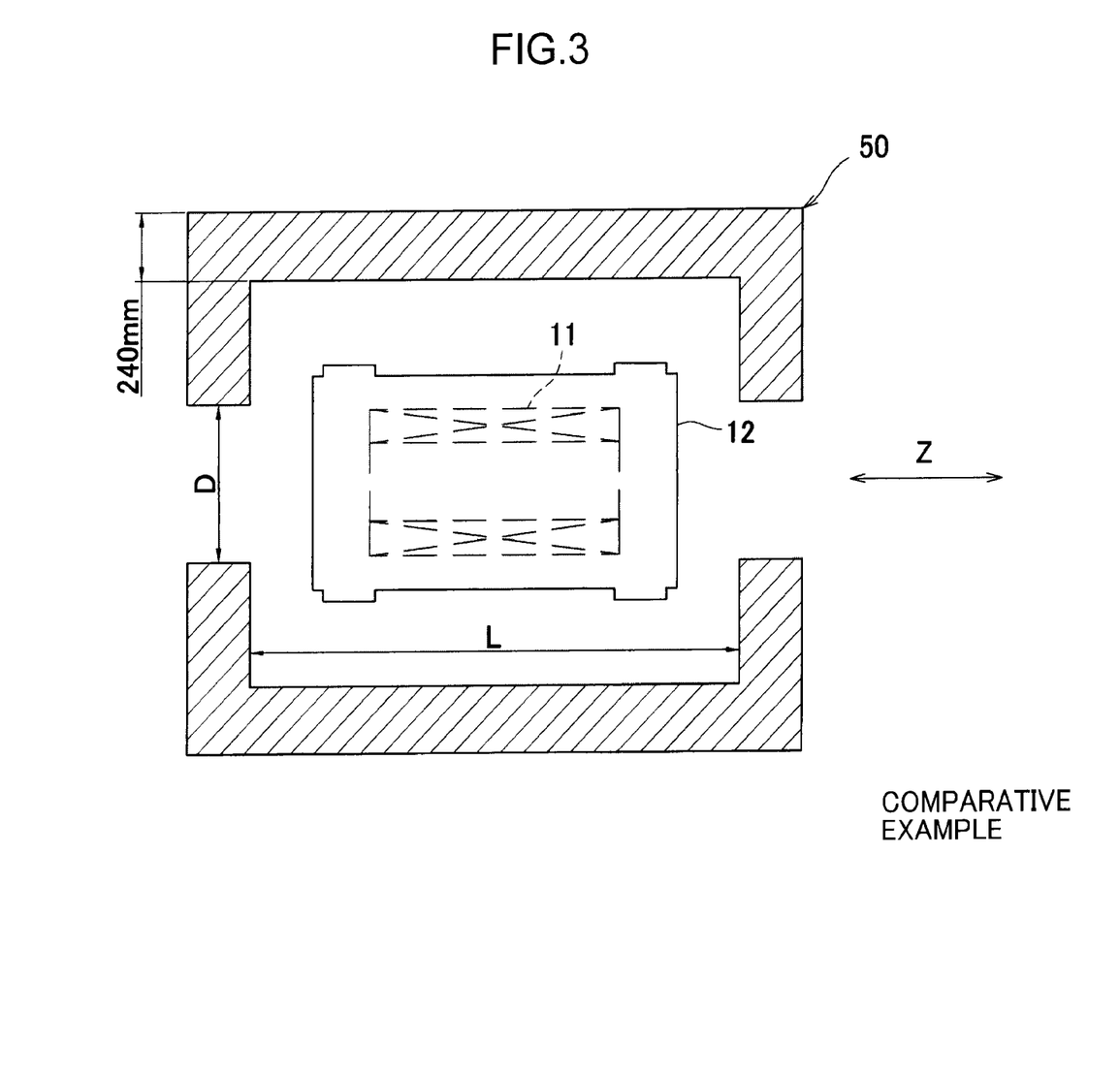
FIG. 3 is a side sectional view showing a state in which a single-layer magnetic shield according to a comparative example is disposed to surround a cryostat.

FIG. 3 is a diagram showing a single-layer magnetic shield 50 according to a comparative example. The single-layer magnetic shield 50 is a cylindrical magnetic shield formed of a magnetic material including only one layer.

(Verification Result of a Fringe Field)

A magnetic field (a fringe field) from the superconducting magnet 11 leaking from the magnetic shields was calculated concerning each of the multilayer magnetic shields 21 and 22 in the first and second embodiments and the single-layer magnetic shield 50 in the comparative example. First, conditions are described. The materials of the multilayer magnetic shields 21 and 22 and the single-layer magnetic shield 50 were iron and all weights of the multilayer magnetic shields 21 and 22 and the single-layer magnetic shield 50 were 20 tons. As indicated by common signs L and D in FIGS. 1 to 3, all of inside dimensions in the axial direction of the magnetic shields disposed on the innermost side were set to the same L mm and all of the diameters of the holes formed in the magnetic shields were set to the same D mm. As shown in FIG. 3, the thickness of a cylindrical section and a flange section of the single-layer magnetic shield 50 was set to 240 mm. Concerning the multilayer (two-layer) magnetic shield 21 shown in FIG. 1, all of the thicknesses of the cylinder sections 1a and 2a and the flange sections 1b and 2b of the magnetic shields 1 and 2 were set to 120 mm and the space S was set to 100 mm. Concerning the multilayer (four-layer) magnetic shield 22 shown in FIG. 2, as shown in the figure, all of the thicknesses of the cylinder sections 3a to 6a and the flange sections 3b to 6b of the magnetic shields 3 to 6 were set to 60 mm and all of the spaces between the magnetic shields adjacent to each other were set to 30 mm.

Figure 1:
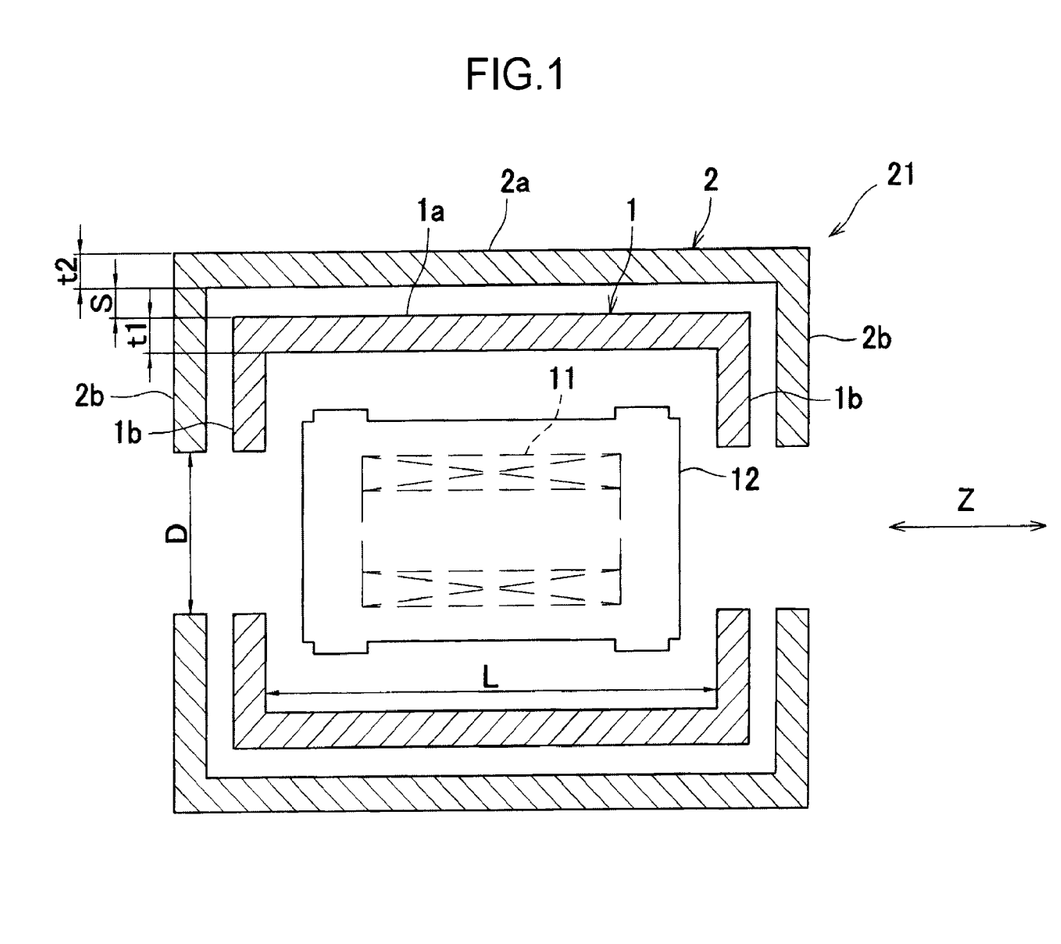
FIG. 1 is a side sectional view showing a state in which a multilayer magnetic shield according to a first embodiment of the present invention is disposed to surround a cryostat.
Figure 4:
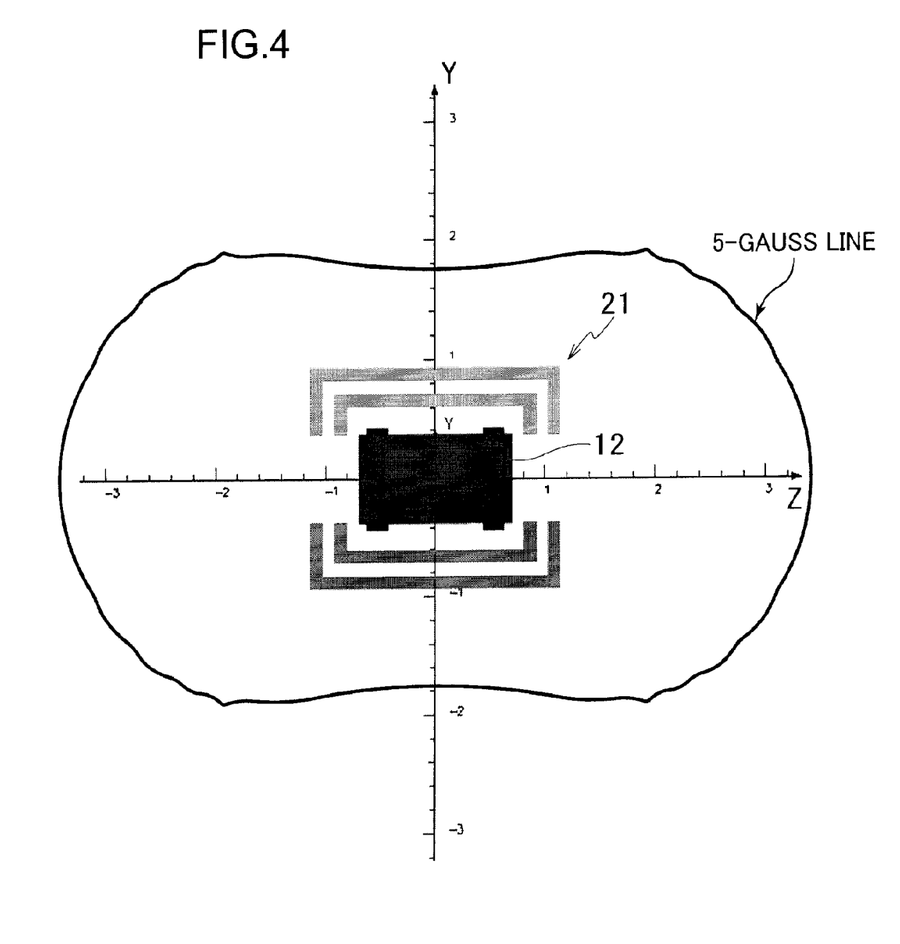
FIG. 4 is a diagram showing a fringe field in the case of the first embodiment shown in FIG. 1.
Figure 5:
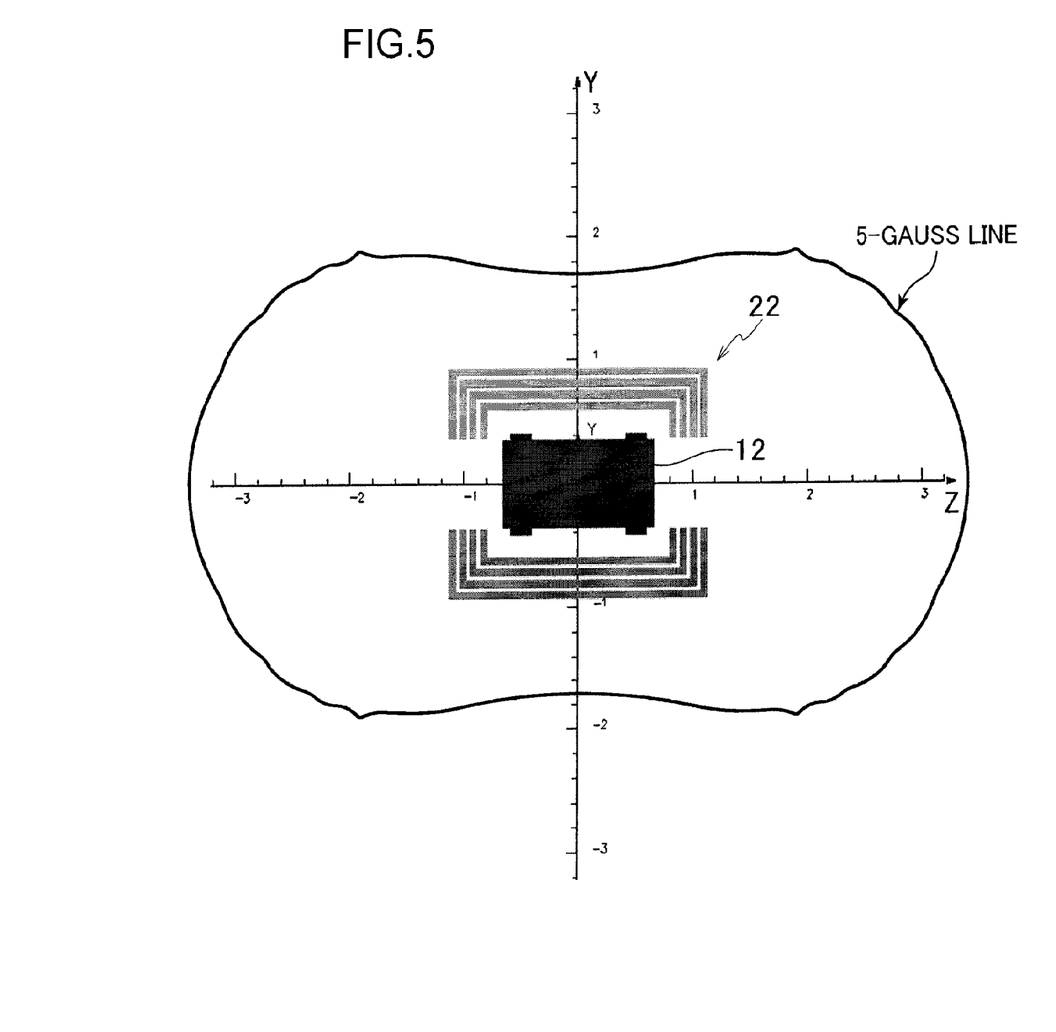
FIG. 5 is a diagram showing a fringe field in the case of the second embodiment shown in FIG. 2.
Figure 6:
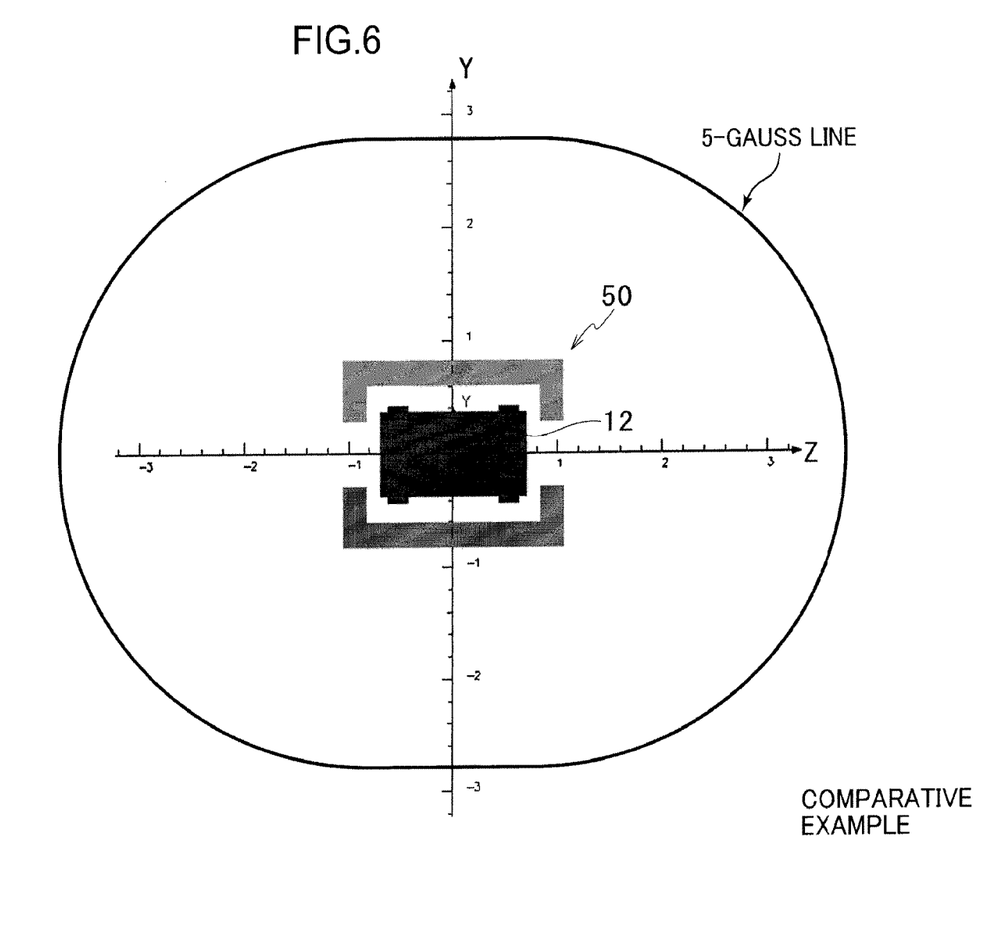
FIG. 6 is a diagram showing a fringe field in the case of the comparative example shown in FIG. 3.

FIGS. 4 to 6 are diagrams respectively showing fringe fields in the cases of the first embodiment (the multilayer (two-layer) magnetic shield 21 shown in FIG. 1), the second embodiment (the multilayer (four-layer) magnetic shield 22 shown in FIG. 2), and the comparative example (the single-layer magnetic shield 50 shown in FIG. 3). As it is seen from FIGS. 4 to 6, in the cases of the multilayer magnetic shields 21 and 22, the fringe fields are clearly smaller than the fringe field in the case of the single-layer magnetic shield 50. This is because a magnetic shield formed of magnetic materials is multi-layered and magnetic shields are disposed with a predetermined space therebetween, whereby the inverted magnetic field effect of the magnetic shields is weakened and the magnetic shields are easily magnetized. A decrease in a fringe field at the same weight means that, when the size of the fringe field is set equal, it is possible to reduce an amount of use of iron (the magnetic material), that is, it is possible to reduce the weight of the magnetic shields.

It is seen from FIGS. 4 and 5 that, in comparison of the case of the multilayer (two-layer) magnetic shield 21 and the case of the multilayer (four-layer) magnetic shield 22, the fringe field is slightly small in the case of the multilayer (four-layer) magnetic shield 22 compared with the case of the multilayer (two-layer) magnetic shield 21. From these results, it is seen that, as the number of layers of the magnetic shields is increased more, the effect of the multilayer magnetic shield is improved but the growth of the effect improvement decreases. Therefore, from the viewpoint of costs, the magnetic shields desirably are only two layers in total as in the first embodiment shown in FIG. 1.

The embodiments are generally explained.

A multilayer magnetic shield in the embodiments is a multilayer magnetic shield formed of magnetic materials and disposed on the outer side of a superconducting magnet, the multilayer magnetic shield including: a first magnetic shield disposed on the outer side of the superconducting magnet; and a second magnetic shield disposed on the outer side of the first magnetic shield. The first magnetic shield includes: a first cylinder section formed in a cylindrical shape and enclosing the superconducting magnet from the outer side in the radial direction of the superconducting magnet; and a pair of first flange sections connected to an end portion in the axial direction of the first cylinder section and extending from the end portion inward in the radial direction of the first cylinder section. The second magnetic shield includes: a second cylinder section formed in a cylindrical shape larger than the first cylinder section and enclosing the first cylinder section from the outer side in the radial direction of the first cylinder section; and a pair of second flange sections connected to an end portion in the axial direction of the second cylinder section and extending from the end portion inward in the radial direction of the second cylinder section. The second cylinder section is disposed in a position with a predetermined space from the first cylinder section in the radial direction of the first cylinder section. The pair of second flange sections is disposed in positions with the predetermined space from the pair of first flange sections in the axial direction of the first cylinder section.

The multilayer magnetic shield includes the first magnetic shield and the second magnetic shield respectively formed of the magnetic materials, and the first magnetic shield and the second magnetic shield are disposed with the predetermined space therebetween. Therefore, an inverted magnetic field effect of the magnetic shields is weakened and the magnetic shields are easily magnetized. Therefore, it is possible to suppress an increase in a fringe field due to quenching while avoiding a marked increase in weight. In other words, it is possible to obtain a shield effect equivalent to the shield effect of the conventional magnetic shield by the passive shield method using the magnetic materials fewer than in the past. That is, it is possible to reduce the weight of the magnetic shield (the passive shield) formed of the magnetic materials and disposed on the outer side of the superconducting magnet.

In the multilayer magnetic shield, it is preferable that the thickness of the first cylinder section, the thickness of the pair of first flange sections, the thickness of the second cylinder section, and the thickness of the pair of second flange sections are equal to one another, and the predetermined space between the first cylinder section and the second cylinder section and the predetermined space between the pair of first flange sections and the pair of second flange sections are 20% or more of the thickness of the first cylinder section. Consequently, the easiness of the magnetization of the magnetic shields is further improved.

In the multilayer magnetic shield, it is preferable that the multilayer magnetic shield further includes: a third magnetic shield disposed on the outer side of the second magnetic shield; and a fourth magnetic shield disposed on the outer side of the third magnetic shield, the third magnetic shield includes: a third cylinder section formed in a cylindrical shape larger than the second cylinder section and enclosing the second cylinder section from the outer side in the radial direction of the second cylinder section; and a pair of third flange sections connected to an end portion in the axial direction of the third cylinder section and extending from the end portion inward in the radial direction of the third cylinder section, and the fourth magnetic shield includes: a fourth cylinder section formed in a cylindrical shape larger than the third cylinder section and enclosing the third cylinder section from the outer side in the radial direction of the third cylinder section; and a pair of fourth flange sections connected to an end portion in the axial direction of the fourth cylinder section and extending from the end portion inward in the radial direction of the fourth cylinder section.

In this mode, the multilayer magnetic shield includes magnetic shields in four layers. Therefore, the effects explained above are further improved.

This application is based on Japanese Patent application No. 2015-128456 filed in Japan Patent Office on Jun. 26, 2015, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The invention claimed is:

1. A multilayer magnetic shield formed of magnetic materials and disposed on an outer side of a superconducting magnet, the multilayer magnetic shield comprising:
    a first magnetic shield disposed on the outer side of the superconducting magnet; and
    a second magnetic shield disposed on an outer side of the first magnetic shield, wherein
    the first magnetic shield includes:
        a first cylinder section formed in a cylindrical shape and enclosing the superconducting magnet from the outer side in a radial direction of the superconducting magnet; and
        a pair of first flange sections connected to an end portion in an axial direction of the first cylinder section and extending from the end portion inward in a radial direction of the first cylinder section,
    the second magnetic shield includes:
        a second cylinder section formed in a cylindrical shape larger than the first cylinder section and enclosing the first cylinder section from an outer side in the radial direction of the first cylinder section; and
        a pair of second flange sections connected to an end portion in an axial direction of the second cylinder section and extending from the end portion inward in a radial direction of the second cylinder section,
    the second cylinder section is disposed in a position with a predetermined space from the first cylinder section in the radial direction of the first cylinder section, and
    the pair of second flange sections is disposed in positions with the predetermined space from the pair of first flange sections in the axial direction of the first cylinder section.

2. The multilayer magnetic shield according to claim 1, wherein thickness of the first cylinder section, thickness of the pair of first flange sections, thickness of the second cylinder section, and thickness of the pair of second flange sections are equal to one another, and the predetermined space between the first cylinder section and the second cylinder section and the predetermined space between the pair of first flange sections and the pair of second flange sections are 20% or more of the thickness of the first cylinder section.

3. The multilayer magnetic shield according to claim 1, further comprising:
    a third magnetic shield disposed on an outer side of the second magnetic shield; and
    a fourth magnetic shield disposed on an outer side of the third magnetic shield, wherein
    the third magnetic shield includes:
        a third cylinder section formed in a cylindrical shape larger than the second cylinder section and enclosing the second cylinder section from the outer side in the radial direction of the second cylinder section; and
        a pair of third flange sections connected to an end portion in an axial direction of the third cylinder section and extending from the end portion inward in a radial direction of the third cylinder section, and
    the fourth magnetic shield includes:
        a fourth cylinder section formed in a cylindrical shape larger than the third cylinder section and enclosing the third cylinder section from the outer side in the radial direction of the third cylinder section; and
        a pair of fourth flange sections connected to an end portion in an axial direction of the fourth cylinder section and extending from the end portion inward in a radial direction of the fourth cylinder section.

* * * * *